United States Patent [19]

Yoshimura

[11] Patent Number: 4,528,746

[45] Date of Patent: Jul. 16, 1985

[54] DEVICE FOR DISMOUNTING INTEGRATED CIRCUIT DEVICES

[75] Inventor: Hiroshi Yoshimura, Osaka, Japan

[73] Assignee: Hakko Metal Industries Limited, Osaka, Japan

[21] Appl. No.: 498,666

[22] Filed: May 31, 1983

[30] Foreign Application Priority Data

Aug. 31, 1982 [JP] Japan ............................ 57-132063[U]

[51] Int. Cl.³ ...................... H01R 43/02; B23P 19/04
[52] U.S. Cl. ........................................ 29/743; 29/764; 219/229; 228/55; 228/264
[58] Field of Search ........................ 29/764, 762, 743; 228/264, 51, 55; 219/229, 230

[56] References Cited

U.S. PATENT DOCUMENTS

| | | | |
|---|---|---|---|
| 2,261,015 | 10/1941 | Brody | 228/55 X |
| 3,382,564 | 5/1968 | Gallentine | 219/230 X |
| 3,990,863 | 11/1976 | Palmer | 29/764 |
| 4,295,596 | 10/1981 | Doten | 228/264 X |

Primary Examiner—Carl E. Hall
Attorney, Agent, or Firm—Mason, Fenwick & Lawrence

[57] ABSTRACT

A device for dismounting an integrated circuit package soldered on a printed electric circuit board by melting the solder, including an electric heater which heats a heating shank disposed so as to contact upper portions of soldered portions of a plurality of leads soldered to circuit ends on an electric circuit board wherein the leads extending from side walls of an IC package mounted on the board. A suction cup member is disposed in a center portion of the heating shank so as to face an upper surface of the IC package and dismount the IC package sucked thereby from the board after melting the solder.

3 Claims, 5 Drawing Figures

DEVICE FOR DISMOUNTING INTEGRATED CIRCUIT DEVICES

BACKGROUND OF THE INVENTION

This invention relates to a device for dismounting an integrated circuit device, and more particularly to a device for melting soldered portions of an integrated circuit device (hereinafter referred to briefly as "IC"), lead portions of which have been soldered to a printed circuit board for an electronic circuit, and dismounts the IC from said circuit board.

The ICs employed in the recently developed electronic components are very small, not only in overall size and shape but, especially, in the length of leads. A typical method for mounting these ICs comprises soldering the ICs and other electronic parts integratedly to a printed circuit board in electrically conductive relationship with each other. The ICs once soldered to the printed circuit board, however, have sometimes to be dismounted, because of a defect therein or a wrong arrangement thereof, by melting the soldered portions.

A conventional method of dismounting an IC package having a plurality of leads extending from its periphery and soldered to the corresponding conductive portions printed on the circuit board comprises melting the solder at each of the leads with a soldering ion and picking out each lead with a pair of tweezers or the like one by one until the entire IC is completely removed from the board. This conventional method is disadvantageous in that since an IC has many soldered leads, considerable manual work is required to dismount the IC and since the leads of the IC are of short length (a recent standard lists a flat-package type IC having a lead pitch of 1.27 millimeters, a lead width of 0.51 to 0.35 millimeters and a lead length of 0.25 millimeters), the dismounting work is delicate and requires a great deal of skill. Moreover, the conventional method has the additional disadvantage that mechanical damage to the body and leads of an IC is inevitable, the functions of the semiconductor contained in the IC are sometimes adversely affected by the heat evolved from the melting solder, and the printed circuit board which is more expensive than the ICs is sometimes damaged to the extent that it cannot be reused.

SUMMARY OF THE INVENTION

It is therefore a primary object of this invention to provide a device which overcomes the above-mentioned problems which have been encountered inevitably in dismounting the IC or miniaturized flat package type IC carrying a plurality of short leads from a printed circuit board.

It is a further object of this invention to provide a device with which the ICs mounted on a printed circuit board in a short time without damaging the ICs or the board, can be dismounted positively, safety and even by unskilled personnel.

DESCRIPTION OF THE PREFERRED EMBODIMENTS

Figure 1:
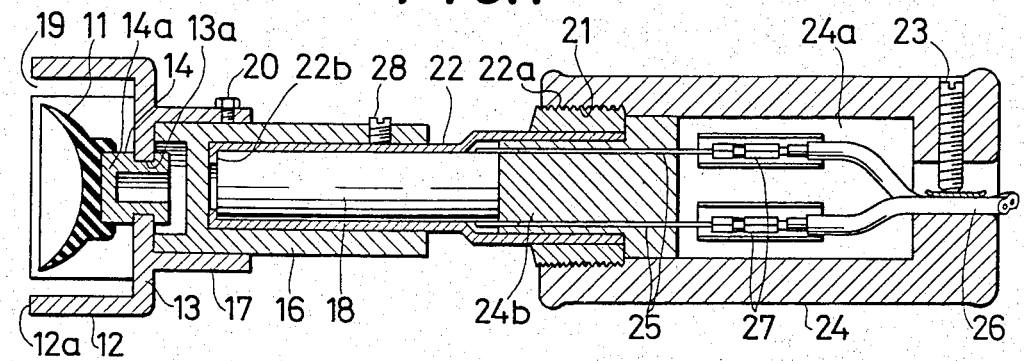
FIG. 1 is a front sectional elevation view of a device for dismounting ICs from a printed circuit board as a preferred embodiment of this invention.
Figure 3:
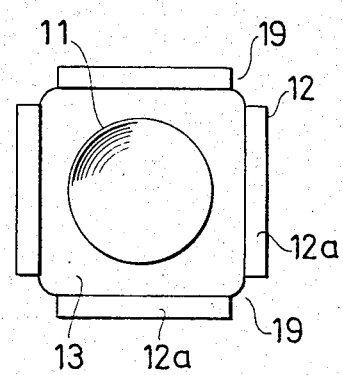
FIG. 3 is a bottom plan view of the device viewed from the bottom side in FIG. 1.
Figure 2:
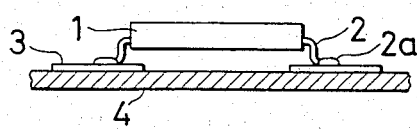
FIG. 2 is a sectional view showing a printed circuit board and an IC mounted thereon which are typically handled by the device of FIG. 1.

Referring, now, to FIGS. 1 through 3, there is illustrated a preferred embodiment of this invention. A device of this embodiment includes a suction cup 11 made of rubber or high polymer material and a heating shank means 12 having four legs vertically extending from its top wall member and disposed around said suction cup 11 with spacings 19 between adjacent legs. Lower ends 12a of the heating shank means 12 correspond to the positions of soldered portions 2a of a plurality of leads 2 which are disposed on the periphery of an IC package 1. The heating shank 12 at an upper portion thereof has an integral top, wall member 13, and a hole 13a for supporting a suction cup holder 14 is formed at a substantially central portion of said top wall member 13. Secured to a lower end 14a of a cylindrical member 14 is the suction cup 11. Methods for securing the sucker to said member may comprise vulcanization binding, clamping and the like.

The suction cup holder 14 is made of a material having low thermal conductivity, high mechanical strength and a high stability, such as porous ceramic or the like. The sucker 11 is made of a heat-resisting rubber material, such as silicone rubber, fluoride rubber or the like. A predetermined number of holes (not shown in the drawings) are formed in predetermined positions of the heating shank means 12 and the top wall member 13 for ventilation of air and radiation of heat therethrough. As illustrated in FIG. 3, the above-mentioned spaces formed in the heating shank 12 are as wide as those portions of the IC package which are free from its leads, and are extending to the top wall member 13. Through the spaces 19 the inside of the heating shank means 12 may be observed from the outside. On an upper surface of the top wall member 13 there is disposed a dismountable heat conductive sleeve 17 fitting to a configuration of a cylindrical tip 16 which is mounted on an electric heater 18 extending downwardly from a handle 24. The sleeve 17 is tightly fitted over the tip 16 and fixed to the latter by a screw 20.

A cable 26 extends to an internal portion 24a of the handle 24 from one end thereof, and is fixed to the handle 24 by a cable fixing screw 23.

A female screw 21 formed on an opening at the other end of the handle 24 is engaged with a mounting screw 22a on an upper portion of an electric heater supporting cylinder 22. The heater 18 is inserted within the cylinder 22, and a pair of leads 25 connected to an upper portion of the heater 18 are connected with wires of the cable 26 through a pair of connecting terminals 27. A receiving flange 22b is disposed on a lower portion of the heater supporting cylinder 22. A fixing screw 28 is disposed for connecting the heater 16 with the cylinder 22. A heat insulator 24b is inserted within a lower end of the internal portion 24a of the handle 24. The heater 16 of this embodiment is constructed such that a heating element is contained within a ceramic body.

The above-mentioned construction in accordance with this invention provides the following advantages as described hereinafter.

The lower end portions 12a of the heating shank means 12 are properly put on soldered portion 2a of conductors 3 on a printed circuit board 4 to which the leads 2 of the IC package to be dismounted are soldered, whereby the suction cup 11 is fitted to the upper surface of the package 1. Then, the heat from the heater 18 energized through the cable 26 is applied via the tip 16 to the soldered portions 2a through the sleeve 17, the top wall member 13 and lower end portions 12a of the heating shank means 12, so that the solder in the soldered portions 2a is melted as the temperature rises. Since the suction cup 11 is fitted to the package 1 by a suction force, when the handle 24 is lifted up as it is, the package 1 is separated from the printed circuit board 4 together with the sucker 11, whereby it is dismounted.

By adjusting the output of the heater 18 and the amount of heat transfer to the lower end 12a of the heating shank means 12 to a predetermined level, the time of melting the above-mentioned solder can be reduced to a short time of several seconds. Thus, this short time is the time necessary for dismounting an IC according to this invention. Thus, the dismounting work can be completed in a very short time as compared with the conventional method in which the leads are picked up one after another using a pair of tweezers.

The device according to this invention never deforms the leads of an IC package because the leads are not picked by a pair of tweezers. Moreover, since the surface of a printed circuit board is never contacted by a soldering iron nor a pair of tweezers, any large pressure is not applied to a localized portion of the board, so that the board is never damaged by the dismounting operation according to this invention. Furthermore, since the heating around the IC package by the heating shank means 12 occurs only for a short time and once, the heat does not adversely affect the IC element.

When the IC package 1 has a different size and configuration from that of FIG. 2, a replacement component comprising a heating shank means with the corresponding size, a form and arrangement and a heat conductive sleeve may be fitted to the tip 16.

When the IC package 1 has a different height from that of FIG. 2, the component having the suction cup 11 mounted on the top wall member 13 in a different elevation suited for the IC package has only to be replaced with that mounted on the tip 16 as a spare component.

Figure 4:
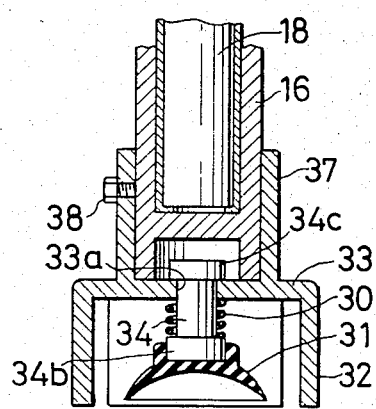
FIG. 4 is a front sectional elevation view of a device as another embodiment of this invention.

In order to avoid the troublesome preparation for a large number of such spare components having suckers 11 with different heights, a modified device is illustrated in FIG. 4. In this modified embodiment, a suction cup holder 34 is coupled to an opening 33a formed on a top wall member 33 of a heating shank means 32 so as to move vertically, and the suction cup 31 is biassed downward by a coil spring 30 disposed between a lower surface of the top wall member 33 and an upper surface of a suction cup mounting nut 34b for the suction cup 34. The suction cup holder cup holder 34 at an upper end thereof is provided with a stopper head 34c for preventing the holder from slipping off the top wall member 33. A heat conductive sleeve 37 and a fixing screw 38 are disposed in the same way as in the device of FIG. 1. The device of this embodiment has the advantage that since the downwardly biassed force by the spring 30 is effectively applied to an IC package with a different height, the sucker 31 is firmly fitted to the package by sucking the same.

Figure 5:
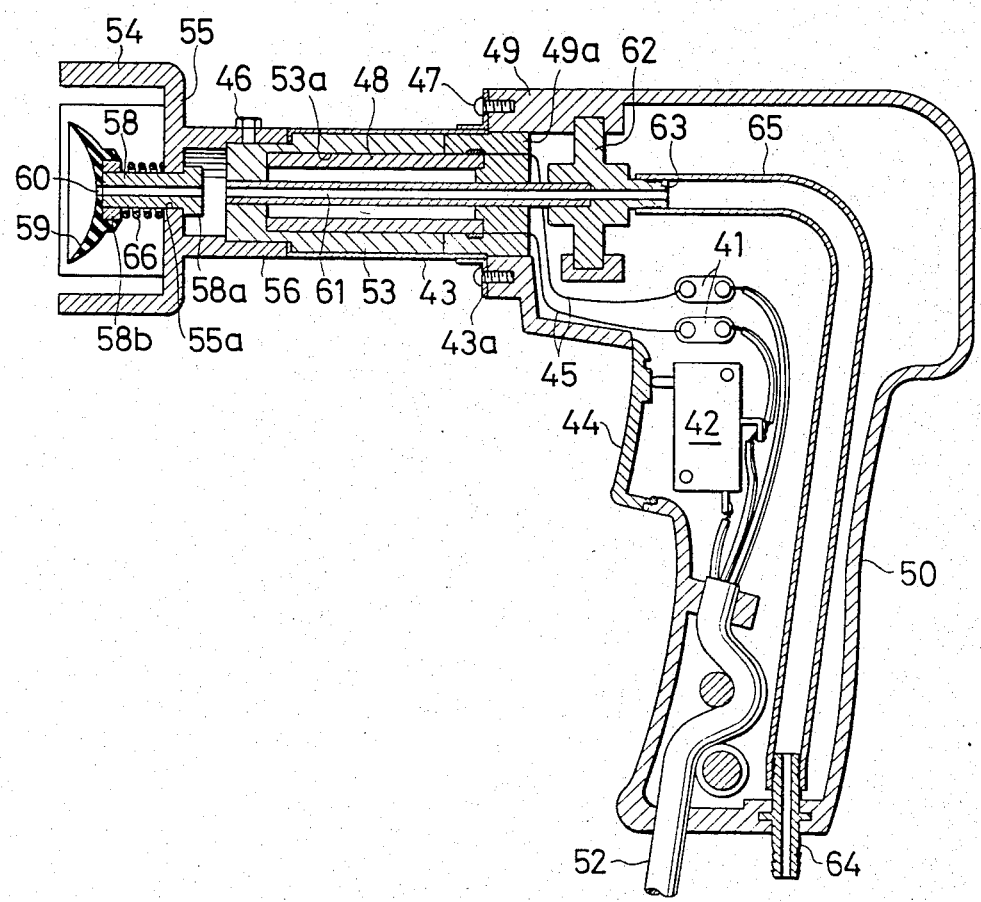
FIG. 5 is a front sectional elevation view of the device as another embodiment of this invention.

Referring to FIG. 5, there is shown another embodiment of this invention. In this embodiment, a heater 48 has a cylindrical configuration and is inserted within a cylindrical hole 53a of a cylindrical tip 53. The tip 53 at a periphery thereof is supported by a supporting cover 43. A flange 43a formed at an upper end of the cover 43 is fixed by screws 47 to the mouth portion of a pistol-shaped frame 49. A pair of wires 45 extending from the heater 48 are connected with wires of a externally extending cable 52 through a switch 42 which is actuated by a trigger 44 disposed in a grip portion 50 of the frame 49. The numeral 41 denotes terminals of the switch.

On a lower portion of the cylindrical tip 53 there is mounted a sleeve 56 formed on a top wall member 55 of a heat shank means 54, and the sleeve 56 is fixed by a fixing screw 46, in the same way as in the device of FIG. 1. A cylindrical suction cup holder 58 is supported for a vertically slidable movement by a supporting hole 55a formed in a center of the top wall member 55. A head portion 58a is formed on an upper end of the holder 58. On a lower end of the holder 58, there is mounted a mounting nut 58b on which a suction cup 59 is mounted as a single unit. The reference numeral 49a represents a heat insulator. An air hole 60 extends through the sucker 59 and the cylindrical sucker holder 58 in their centers to an air-intake pipe 61 which is disposed in the centers of the cylindrical tip 53 and the cylindrical heater 48. An upper end of the air-intake pipe 61 is connected to a supporting-and-connecting piece 62 within the pistol-shaped frame 49. A vacuum exhaust tube 65 is connected between a mouth 63 of the piece 62 and a connecting pipe 64 installed in a tail portion of the grip portion 50. The pipe 64 is further connected to a vacuum pump (not shown in drawings) through a conduit. When the pump is energized, the room between the suction cup 59 and an upper surface of an IC package (not shown in drawings) becomes vacuum so that the IC package is suction cup by the suction cup 59, whereby the IC package is dismounted after the solder is melted by the heating shank means 54.

What is claimed is:

1. A device for dismounting an IC package, comprising a handle, a heating tip receiving heat from an electric heater projecting from one end of the handle, a heat conductive sleeve removably mounted on a lower end of said heating tip, a heating shank means with four pending legs extending downwardly and disposed below said sleeve, and a suction cup holder disposed downwardly of a center of a top wall member of said heating shank means, a suction cup mounted on a lower end of said holder, said holder at an upper end thereof including a stopper head and being slidably supported within a hole formed in said top wall member of said heating shank means, and a coil spring positioned between said top wall member and a nut disposed to be engaged with a lower end of said suction cup holder.

2. A device for dismounting an IC package, comprising a pistol-shaped handle, a tip mounted on an electric heater projecting from a pipe within said handle, a heat conductive sleeve which is removably mounted on a lower portion of said tip in a close relationship with each other, a heating shank means with four pending legs extending downwardly as disposed below said sleeve, a hole formed in a top wall member of said heating shank means, a sucker holder slidably inserted in said hole, a stopper formed above said top wall member of said sucker holder, a nut for mounting a sucker on a lower portion of said sucker holder, a coil spring inserted between said nut and said top wall member, an air tube extending through the center of said electric heater and said tip, a conduit connector disposed on a grip end portion of said handle connected with said air tube, and an air hole extending through said sucker holder and said sucker at their centers.

3. A device according to claim 2 further comprising a trigger disposed within a grip portion of said pistol-shaped handle so as to control a switch connected with an electric circuit of said heater.

* * * * *